(12) United States Patent
Wang et al.

(10) Patent No.: US 12,342,729 B2
(45) Date of Patent: Jun. 24, 2025

(54) METHOD OF MANUFACTURING MAGNETIC RANDOM ACCESS MEMORY AND MAGNETIC RANDOM ACCESS MEMORY

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Xiaoguang Wang, Hefei (CN); Huihui Li, Hefei (CN); Xianqin Hu, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 415 days.

(21) Appl. No.: 17/807,016

(22) Filed: Jun. 15, 2022

(65) Prior Publication Data
US 2023/0008840 A1    Jan. 12, 2023

Related U.S. Application Data

(63) Continuation of application No. PCT/CN2022/078050, filed on Feb. 25, 2022.

(30) Foreign Application Priority Data

Jul. 8, 2021 (CN) .......................... 202110773301.8

(51) Int. Cl.
*H10N 50/01* (2023.01)
*H10B 61/00* (2023.01)
*H10N 50/80* (2023.01)

(52) U.S. Cl.
CPC ............. *H10N 50/01* (2023.02); *H10B 61/00* (2023.02); *H10N 50/80* (2023.02)

(58) Field of Classification Search
CPC ............. H01L 21/76897; H01L 21/768; H01L 21/76801; H01L 21/76802;
(Continued)

(56) References Cited

U.S. PATENT DOCUMENTS 9,013,045 B2    4/2015   Satoh et al.
9,589,991 B2    3/2017   Wang et al.
(Continued)

FOREIGN PATENT DOCUMENTS

CN       103811331 A       5/2014
CN       104218094 A       12/2014
(Continued)

OTHER PUBLICATIONS

International Search Report cited in PCT/CN2022/078050 mailed May 7, 2022, 8 pages.
(Continued)

*Primary Examiner* — Latanya N Crawford Eason
(74) *Attorney, Agent, or Firm* — Kilpatrick Townsend & Stockton LLP

(57) ABSTRACT

Embodiments of the present disclosure provide a method of manufacturing a magnetic random access memory (MRAM) and a MRAM. The method includes: preparing a bottom electrode through hole, a bottom electrode, a magnetic tunnel junction (MTJ), a top electrode, and an insulating layer sequentially on a semiconductor substrate; forming a first interlayer dielectric layer on the insulating layer; forming an etching stop layer on the first interlayer dielectric layer; forming a second interlayer dielectric layer on the etching stop layer; etching a part of the second interlayer dielectric layer above the top electrode to the etching stop
(Continued)

layer, and forming a first trench; performing a self-alignment implantation inclined on a part of the first interlayer dielectric layer corresponding to a bottom of the first trench; continuously etching through the first trench to a top end surface of the top electrode, and forming a second trench.

16 Claims, 11 Drawing Sheets

(58) Field of Classification Search
CPC ......... H01L 21/76804; H01L 21/76814; H01L 21/76829; H01L 21/311; H01L 21/3213; H01L 21/7682; H01L 21/76825; H01L 21/76822; H01L 21/3115; H01L 21/31155; H01L 21/02356; H01L 23/5226; H01L 21/76816; H01L 21/76877; H01L 21/2253; H01L 21/2633; H10N 50/01; H10N 50/80; H10B 61/00
See application file for complete search history.

(56) References Cited

U.S. PATENT DOCUMENTS

| | | | |
|---|---|---|---|
| 10,304,903 B2 | 5/2019 | Chuang et al. | |
| 10,411,068 B2 | 9/2019 | Wiegand et al. | |
| 10,727,397 B1 | 7/2020 | Wang et al. | |
| 10,790,439 B2 | 9/2020 | Ku et al. | |
| 11,437,433 B2 | 9/2022 | Chen et al. | |
| 2015/0364420 A1* | 12/2015 | Lin | H01L 23/485 |
| | | | 438/668 |
| 2018/0240968 A1 | 8/2018 | Briggs et al. | |
| 2020/0035908 A1* | 1/2020 | Ku | H01F 41/34 |
| 2020/0075669 A1 | 3/2020 | Chuang et al. | |
| 2020/0144484 A1 | 5/2020 | Chen et al. | |
| 2021/0391384 A1* | 12/2021 | Cho | H10N 50/85 |

FOREIGN PATENT DOCUMENTS

| | | |
|---|---|---|
| CN | 107302051 A | 10/2017 |
| CN | 108140724 A | 6/2018 |
| CN | 108417628 A | 8/2018 |
| CN | 110010759 A | 7/2019 |
| CN | 110783451 A | 2/2020 |
| CN | 110875352 A | 3/2020 |
| CN | 111092066 A | 5/2020 |
| CN | 111435702 A | 7/2020 |
| CN | 111613572 A | 9/2020 |

OTHER PUBLICATIONS

Lee, et al., "1Gbit High Density Embedded STT-MRAM in 28nm FDSOI Technology", 2019 IEEE, 4 pages.
International Search Report cited in PCT/CN2021/123606 mailed Mar. 22, 2022, 10 pages.

* cited by examiner

METHOD OF MANUFACTURING MAGNETIC RANDOM ACCESS MEMORY AND MAGNETIC RANDOM ACCESS MEMORY

CROSS-REFERENCE TO RELATED APPLICATIONS

This is a continuation of International Application No. PCT/CN2022/078050, filed on Feb. 25, 2022, which claims the priority to Chinese Patent Application 202110773301.8, titled "METHOD OF MANUFACTURING MAGNETIC RANDOM ACCESS MEMORY AND MAGNETIC RANDOM ACCESS MEMORY" and filed on Jul. 8, 2021. The entire contents of International Application No. PCT/CN2022/078050 and Chinese Patent Application 202110773301.8 are incorporated herein by reference.

TECHNICAL FIELD

The present disclosure relates to the field of semiconductor manufacturing technologies, and in particular, to a method of manufacturing a magnetic random access memory (MRAM) and a MRAM.

BACKGROUND

A MRAM is a non-volatile random access memory capable of retaining its stored data when the power is off. The MRAM includes a magnetic tunnel junction (MTJ), which makes the MRAM read and write at a high speed, have a large capacity, and consume lower power.

In the MRAM, a top electrode and a top electrode contact (TEC) are sequentially formed above the MTJ. In the related art, a through via or a trench is usually formed directly above the top electrode, and then metal is deposited in the through via or the trench to form the TEC, to realize the interconnection between the MTJ and the TEC. However, in the process of etching to form the through via or the trench, over-etching is prone to occur, such that the critical dimension of the through via or the trench is greater than those of the top electrode and the MTJ, and the etched part is likely to extend to the encapsulation layer of the MTJ. As a result, the performance of the MTJ deteriorates, the MTJ may be contaminated by the metal in the subsequent process, and the TEC formed finally does not match the MTJ, thus affecting the performance of the MRAM and decreasing the yield.

SUMMARY

According to an aspect of the present disclosure, a method of manufacturing a magnetic random access memory is provided and includes: preparing a bottom electrode through hole, a bottom electrode, a magnetic tunnel junction, a top electrode, and an insulating layer sequentially on a semiconductor substrate; forming a first interlayer dielectric layer on the insulating layer; forming an etching stop layer on the first interlayer dielectric layer; forming a second interlayer dielectric layer on the etching stop layer; etching a part of the second interlayer dielectric layer above the top electrode to the etching stop layer, and forming a first trench; performing a self-alignment implantation inclined on a part of the first interlayer dielectric layer corresponding to a bottom of the first trench, and forming a self-alignment implantation region; continuously etching through the first trench to a top end surface of the top electrode, and forming a second trench, wherein the first trench and the second trench connect to each other to form a through via, and a critical dimension of the second trench gradually decreases from a bottom position of the first trench toward a direction close to the top electrode; and filling the through via with a top electrode contact.

According to another aspect of the present disclosure, a magnetic random access memory is provided and manufactured by using the method according to any one of the foregoing embodiments.

BRIEF DESCRIPTION OF THE DRAWINGS

The above and other features and advantages of the present disclosure become more apparent by describing exemplary implementations thereof in detail with reference to the accompanying drawings.

Figure 1:
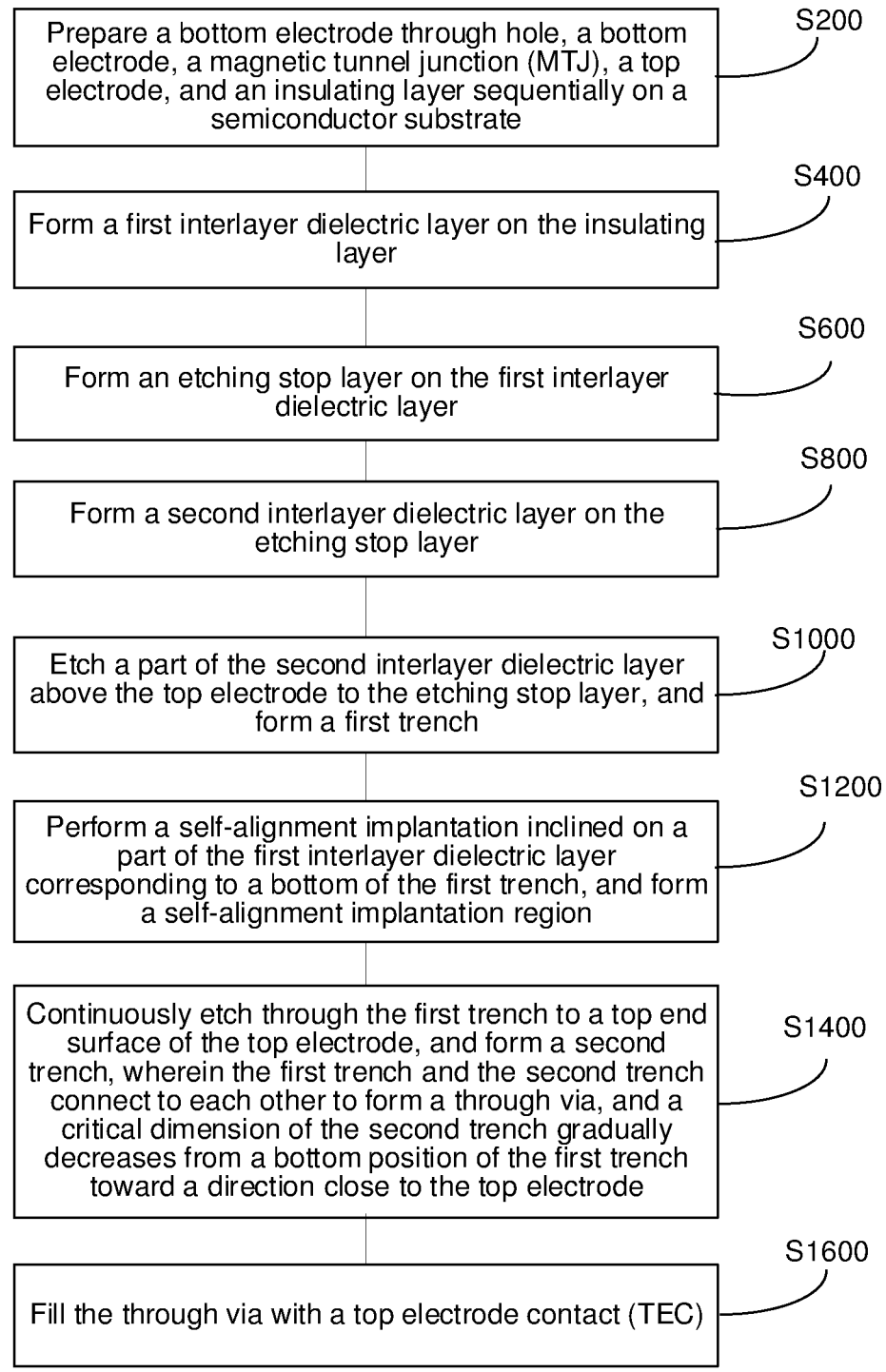
FIG. 1 is a flowchart of a manufacturing method according to an exemplary implementation of the present disclosure.

REFERENCE NUMERALS 1. semiconductor substrate; 11, bottom electrode through hole; 12, bottom electrode; 13, MTJ; 131, reference layer; 132, barrier layer; 133, memory layer; 14, top electrode; 15, insulating layer; 2, first interlayer dielectric layer; 3, etching stop layer; 4, second interlayer dielectric layer; 5, through via; 51, first trench; 52, second trench; 6, tec; S, self-alignment implantation region; F1, first direction; L, perpendicular bisector; α, implantation angle; and β, included angle.

DETAILED DESCRIPTION

The exemplary implementations are described more comprehensively below with reference to the accompanying drawings. However, the exemplary implementations may be implemented in various forms, and may not be construed as a limitation on those described herein. On the contrary, these implementations are provided to make the present disclosure comprehensive and complete and to fully convey the concept of the exemplary implementations to those skilled in the art. The same reference numerals in the figures indicate the same or similar structures, and thus their detailed descriptions are omitted.

Different exemplary implementations of the present disclosure are described below with reference to the accompanying drawings. The accompanying drawings form a part of the present disclosure, which show by way of example different exemplary structures that can implement various aspects of the present disclosure. It should be understood that other specific solutions of components, structures, exemplary apparatuses, systems, and steps may be used, and structural and functional modifications may be made without departing from the scope of the present disclosure. Moreover, although the terms such as "above", "between", and "within" may be used in this specification to describe different exemplary features and elements of the present disclosure, these terms are used herein only for convenience of description, for example, according to the directions of the examples in the accompanying drawings. Nothing in this specification should be understood as requiring a specific three-dimensional direction of the structure to fall within the scope of the present disclosure. In addition, the terms such as "first" and "second" in claims are used only as markers, not as a restriction on the number of objects.

The flowcharts shown in the accompanying drawings are only exemplary illustrations, and it is not mandatory to include all content and operations/steps, or perform the operations/steps in the order described. For example, some operations/steps can also be decomposed, while some operations/steps can be merged or partially merged. Therefore, a particular execution order may change based on a particular situation.

In addition, in the description of the present disclosure, "a plurality of" means at least two, such as two or three, unless otherwise expressly and specifically defined. "Above" and "below" are technical terms indicating orientations. In the embodiments of the present disclosure, the above refers to the direction in which other function layers are sequentially formed on the semiconductor substrate 1. For example, a top electrode 14 is located above the MTJ 13. The technical terms are only for clearer descriptions, and have no limiting effect.

According to an aspect of the present disclosure, a method of manufacturing a MRAM is provided. With reference to FIG. 1 to FIG. 11, FIG. 1 is a flowchart of a manufacturing method according to an embodiment of the present disclosure. FIG. 2 to FIG. 10 are schematic structural diagrams of cross sections of a MRAM in different steps. A filled shape in each cross section does not represent a real structure of a layer, is merely used to distinguish each layer, and therefore does not constitute a limitation. As shown in FIG. 1, the method of manufacturing a MRAM in this embodiment of the present disclosure includes:

step S200: Prepare a bottom electrode through hole 11, a bottom electrode 12, a MTJ 13, a top electrode 14, and an insulating layer 15 sequentially on a semiconductor substrate 1;

step S400: Form a first interlayer dielectric layer 2 on the insulating layer 15;

step S600: Form an etching stop layer 3 on the first interlayer dielectric layer 2;

step S800: Form a second interlayer dielectric layer 4 on the etching stop layer 3;

step S1000: Etch a part of the second interlayer dielectric layer 4 above the top electrode 14 to the etching stop layer 3 and form a first trench 51; step S1200: Perform a self-alignment implantation inclined on a part of the first interlayer dielectric layer 2 corresponding to a bottom of the first trench 51, and form a self-alignment implantation region S;

step S1400: Continuously etch through the first trench 51 to a top end surface of the top electrode 14, and form a second trench 52, wherein the first trench 51 and the second trench 52 connect to each other to form a through via 5, and a critical dimension of the second trench 52 gradually decreases from a bottom position of the first trench 51 toward a direction close to the top electrode 14; and step S1600: Fill the through via 5 with a TEC 6.

In the manufacturing method of the embodiment of the present disclosure, the etching stop layer 3 is disposed on the first interlayer dielectric layer 2, such that the etching is performed until the etching stop layer 3 is reached to form the first trench 51. Moreover, through a self-alignment implantation, a self-alignment implantation region S is formed in the first interlayer dielectric layer 2, to improve the etch selectivity ratio of the self-alignment implantation region S, such that during the following etching, the dimension of the through via 5 can be controlled accurately, the controllability for forming the through via 5 and the dimension uniformity are improved, and therefore critical dimensions of the TEC 6 and the MTJ 13 match, thereby avoiding the performance deterioration of the MTJ 13 and improving the yield of the MRAM.

The method of manufacturing a MRAM in this embodiment of the present disclosure is described in detail below.

Figure 7:
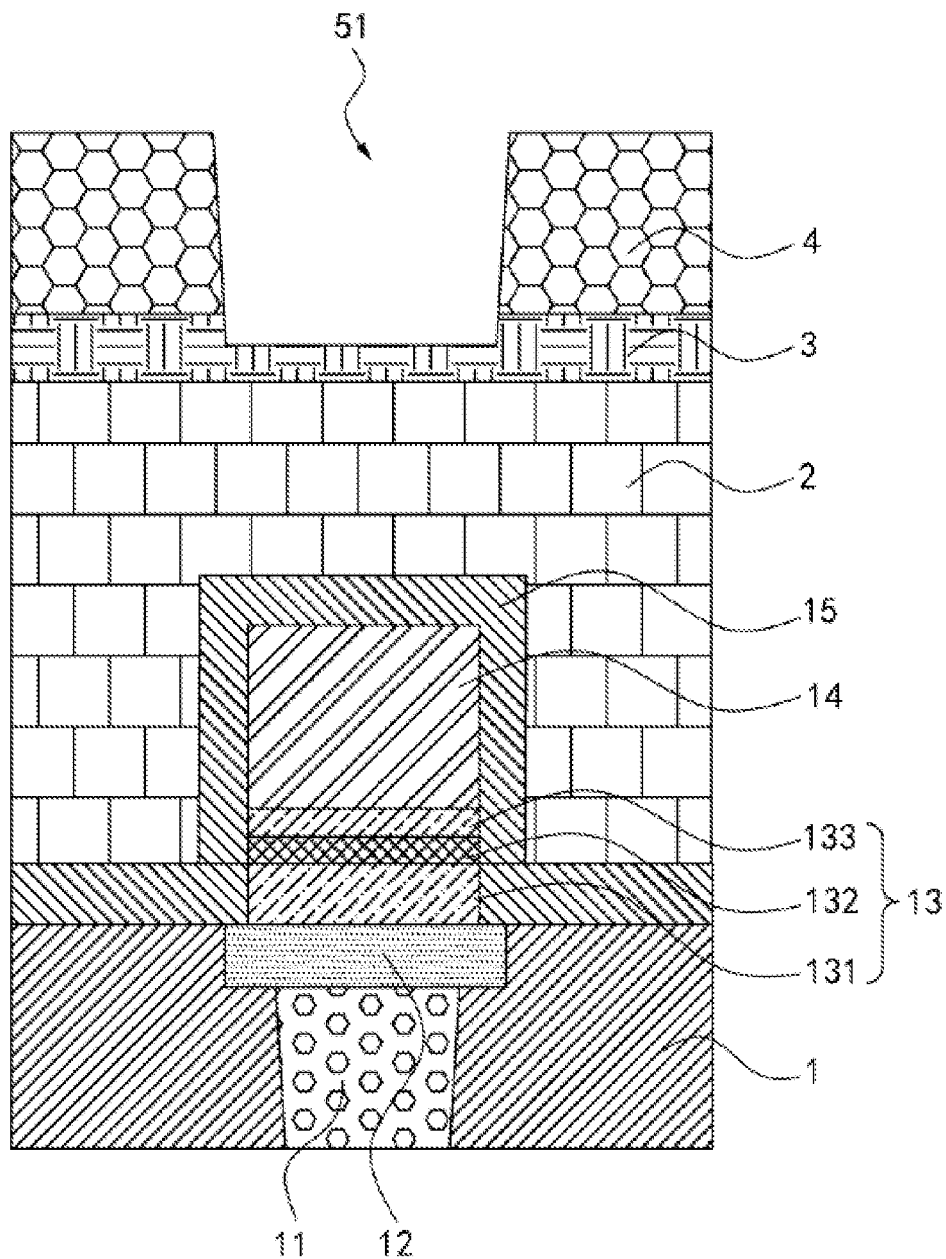
FIG. 7 is a schematic diagram of forming a first trench according to an exemplary implementation of the present disclosure.
Figure 8:
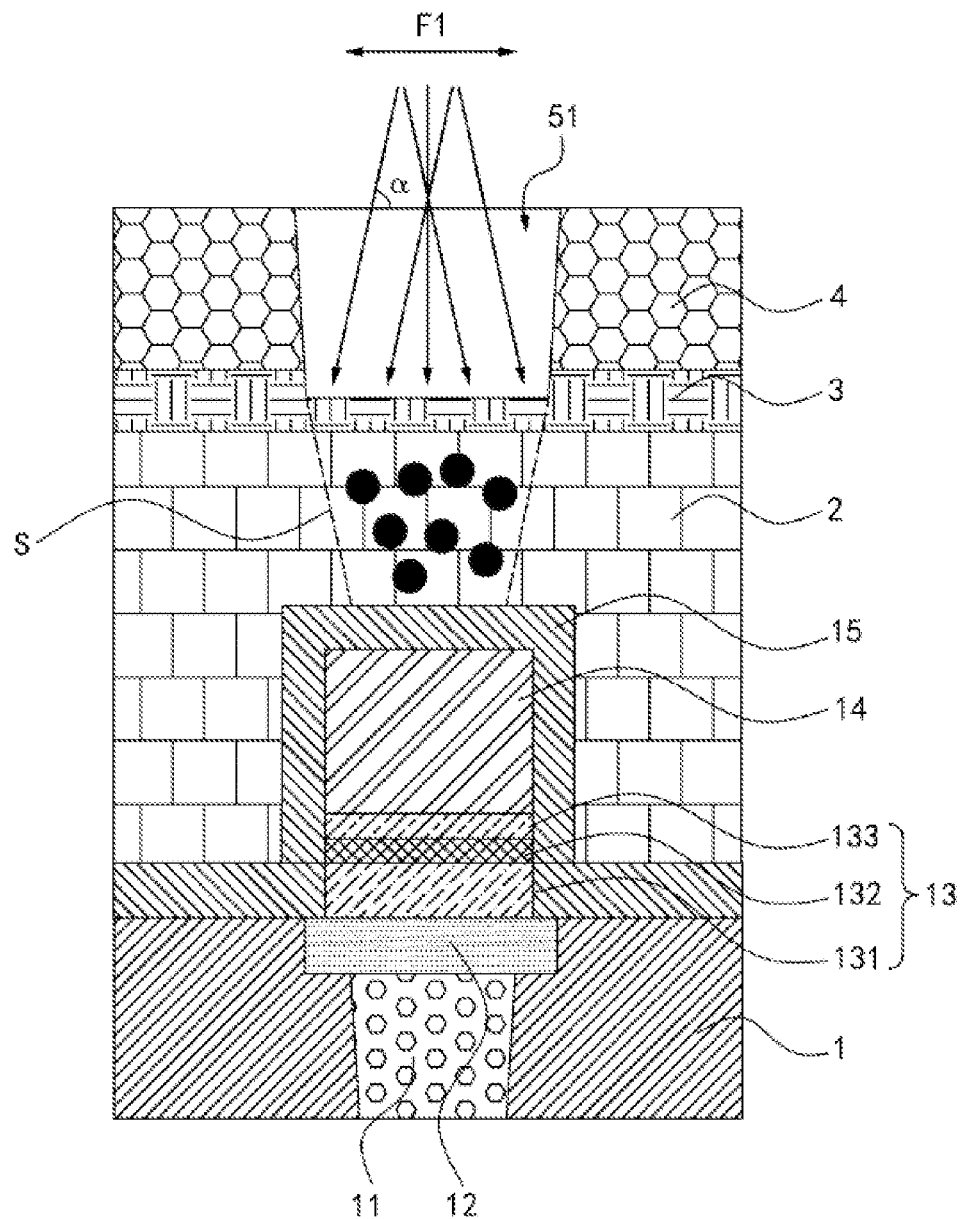
FIG. 8 is a schematic diagram of performing an inclined self-alignment implantation on a bottom of the first trench according to an exemplary implementation of the present disclosure.

It should be noted first that the critical dimension refers to a dimension along a first direction F1 shown in FIG. 8. The cross sections mentioned in the embodiments of the present disclosure all refer to the sections shown in FIG. 2 to FIG. 11.

Step S200: Prepare a bottom electrode through hole 11, a bottom electrode 12, a MTJ 13, a top electrode 14, and an insulating layer 15 sequentially on a semiconductor substrate 1.

Figure 2:
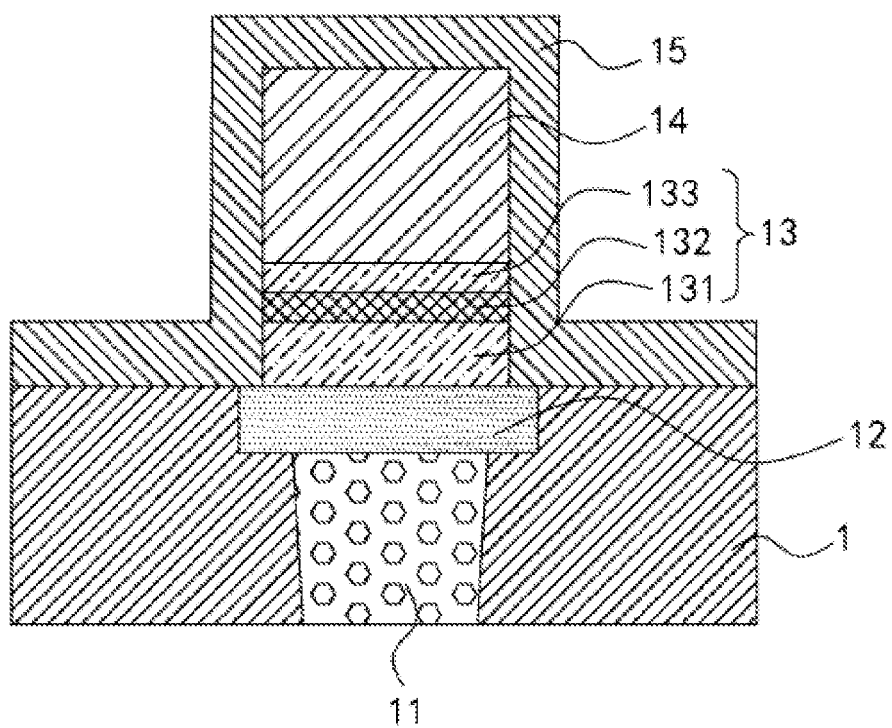
FIG. 2 is a schematic structural diagram of forming a bottom electrode through hole, a bottom electrode, a MTJ, a top electrode, and an insulating layer on a semiconductor substrate according to an exemplary implementation of the present disclosure.

As shown in FIG. 2, the semiconductor substrate 1 is provided. The bottom electrode through hole 11 is formed on the semiconductor substrate 1. The bottom electrode 12, the MTJ 13, the top electrode 14, and the insulating layer are formed sequentially through a deposition above the bottom electrode through hole 11.

The semiconductor substrate 1 in the embodiment of the present disclosure may be made of silicon, silicon carbide, silicon nitride, silicon-on-insulator, stacked silicon-on-insulator, stacked silicon-germanium-on-insulator, silicon-germanium-on-insulator, germanium-on-insulator, or the like. The bottom electrode through hole 11 may be filled with at least one of Ti, TiN, W, WN, Ta, or TaN. The bottom electrode 12 may be also made of at least one of Ti, TiN, W, WN, Ta, or TaN. After the bottom electrode 12 is formed, its surface may be flattened through a planarization process for the subsequent deposition of the MTJ 13.

With reference to FIG. 2, the MTJ 13 includes a reference layer 131, a barrier layer 132, and a memory layer 133 stacked sequentially from bottom to top. The reference layer 131 may be a multi-layer structure, and the thickness of the reference layer 131 may be 10 nm to 30 nm. The material of the barrier layer 132 may be a non-magnetic metal oxide such as MgO or $A_2O_3$, with a thickness of 0.5 nm to 3 nm. The memory layer 133 may have variable magnetic poles and may also be of a multi-layer structure. Its thickness may be 0.8 nm to 2 nm. The total thickness of the MTJ 13 in the embodiment of the present application may be 5 nm to 20 nm such as 8 nm, 12 nm, 16 nm, or 18 nm, which is not particularly limited herein.

The top electrode 14 is formed above the MTJ 13, and may be made of at least one of Ta, TaN, Ti, TiN, W, or WN. Its thickness may be 20 nm to 100 nm.

The insulating layer 15 is formed above the top electrode 14 and the semiconductor substrate 1, and may further be referred to as an encapsulation layer, to encapsulate the bottom electrode through hole 11, the bottom electrode 12, the MTJ 13 and the top electrode 14, thereby insulating them from other function layers.

The material in the bottom electrode through hole 11, the bottom electrode 12, each layer in the MTJ 13, the top electrode 14 and the insulating layer 15 may be all formed through a deposition process. The deposition process may be a chemical vapor deposition process, an atomic layer deposition process, a physical vapor deposition process, an ion beam deposition process, or another process, which is not particularly limited herein.

Step S400: Form a first interlayer dielectric layer 2 on the insulating layer 15.

Figure 3:
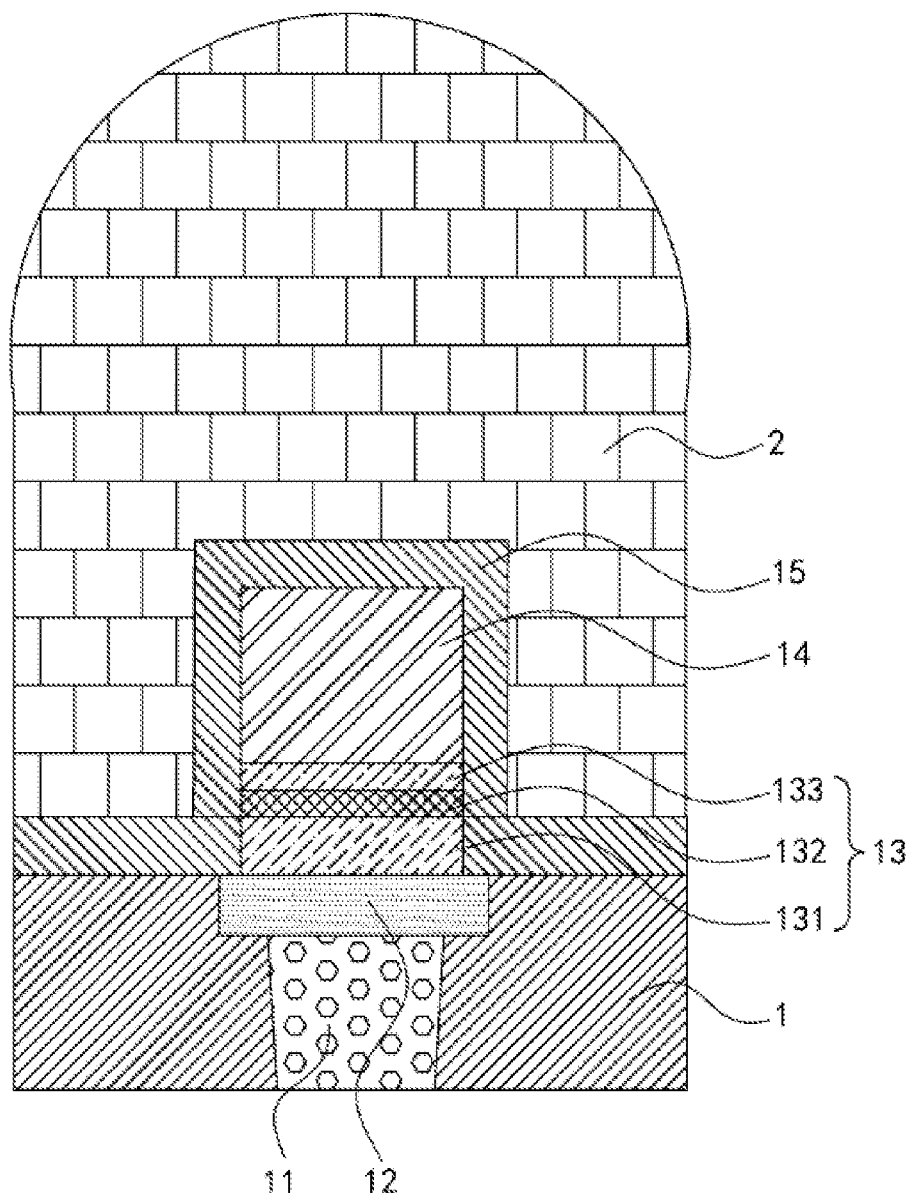
FIG. 3 is a schematic diagram of forming a first interlayer dielectric layer according to an exemplary implementation of the present disclosure.

As shown in FIG. 3, the first interlayer dielectric layer 2 is formed above the insulating layer 15 through the deposition process. The first interlayer dielectric layer 2 may be made of at least one of silicon dioxide, silicon oxynitride, silicon nitride, or a low-k dielectric. The low-k dielectric may be made of hydrosilicate or porous silicate.

Figure 4:
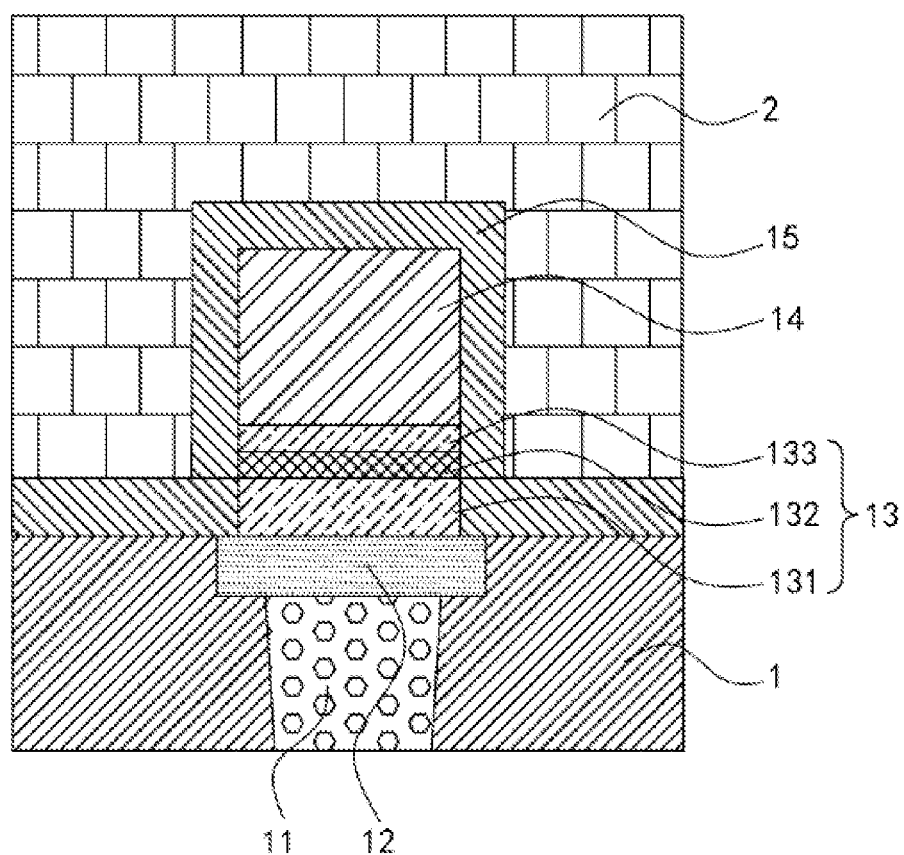
FIG. 4 is a schematic diagram of the first interlayer dielectric layer after polishing according to an exemplary implementation of the present disclosure.

As shown in FIG. 4, after the first interlayer dielectric layer 2 is formed, its top is polished to remove a part thereof and flatten the first interlayer dielectric layer 2, for the subsequent formation of the etching stop layer 3. The first interlayer dielectric layer 2 may be polished through a chemical mechanical polishing (CMP) process.

Step S600: Form an etching stop layer 3 on the first interlayer dielectric layer 2.

Figure 5:
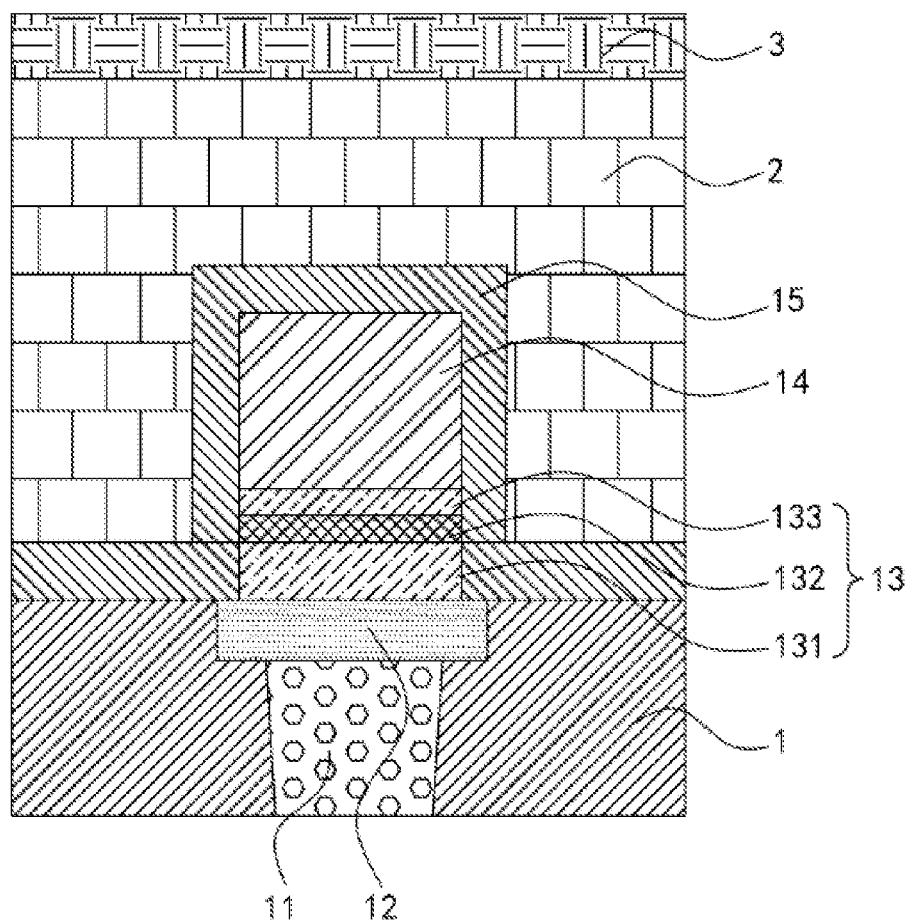
FIG. 5 is a schematic diagram of forming an etching stop layer according to an exemplary implementation of the present disclosure.

As shown in FIG. 5, in the foregoing step, the etching stop layer 3 is formed on the flattened first interlayer dielectric layer 2. The etching stop layer 3 may be made of at least one of silicon carbide, silicon nitride, silicon oxide, or silicon oxynitride. The etching stop layer 3 is made of a same or different material, which is not particularly limited herein. The etching stop layer 3 can improve the etching uniformity.

Step S800: Form a second interlayer dielectric layer 4 on the etching stop layer 3.

Figure 6:
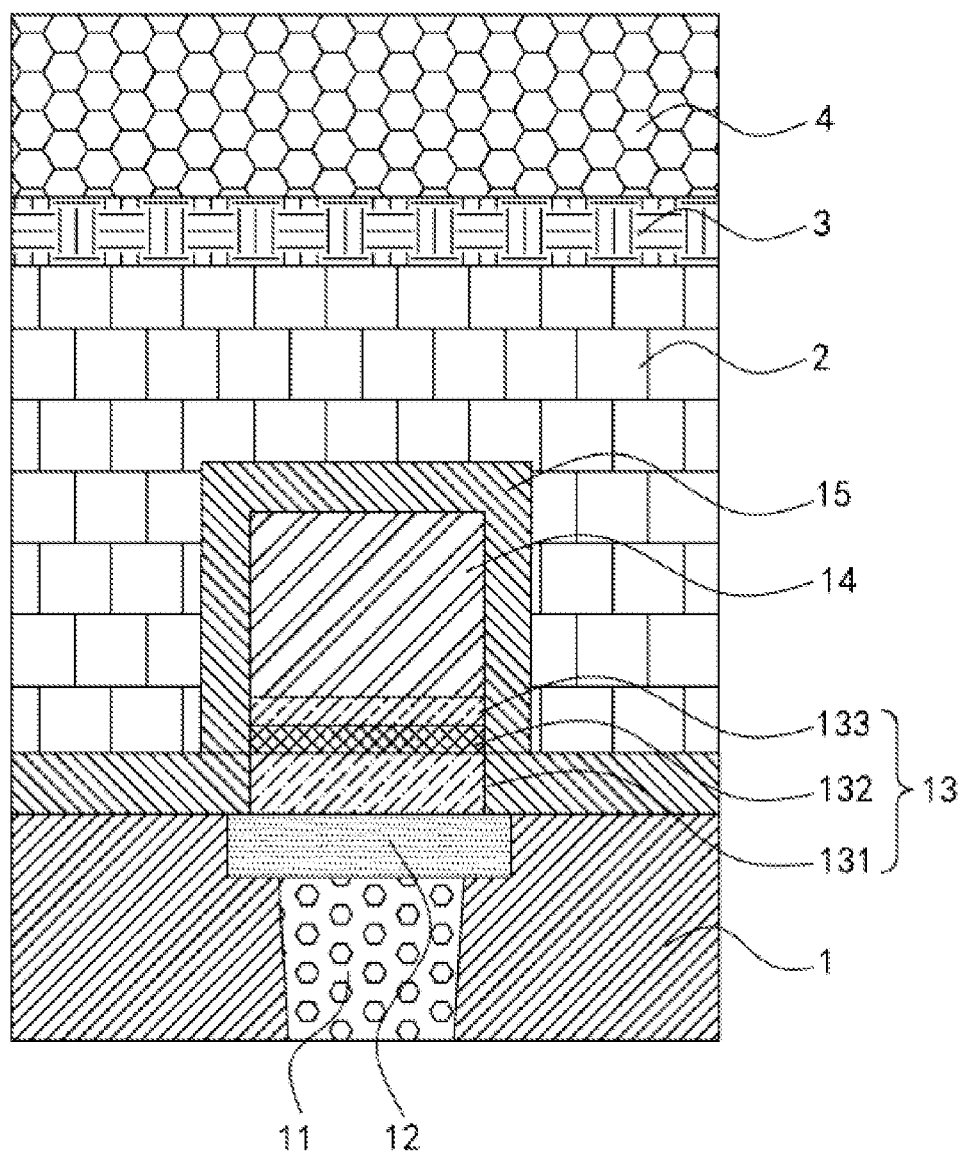
FIG. 6 is a schematic diagram of forming a second interlayer dielectric layer according to an exemplary implementation of the present disclosure.

As shown in FIG. 6, after the etching stop layer 3 is formed, the deposition is continuously performed thereon to form the second interlayer dielectric layer 4. The second interlayer dielectric layer 4 and the first interlayer dielectric layer 2 may be made of a same or different material. The second interlayer dielectric layer 4 may be made of at least one of silicon dioxide, silicon oxynitride, silicon nitride, or a low-k dielectric.

After formed, the second interlayer dielectric layer 4 may be also flattened through the CMP process.

In the embodiment of the present disclosure, the first interlayer dielectric layer 2, the etching stop layer 3, and the second interlayer dielectric layer 4 may be all formed through a deposition process, and the deposition process may include an atomic layer deposition process, a chemical vapor deposition process, a physical vapor deposition process, or a spin coating process.

Step S1000: Etch a part of the second interlayer dielectric layer 4 above the top electrode 14 to the etching stop layer 3 and form a first trench 51.

As shown in FIG. 7, the first trench 51 may be formed through a wet etching process or a dry etching process. The dry etching process may be a plasma etching process in which an etching gas used may be a chlorine gas. The etching degree can be controlled by controlling the volume of the etching gas. Concentrated sulfuric acid and hydrogen peroxide may be used as etchants to perform the wet etching. The etching degree can be also controlled by adjusting the concentrations of the etchants. Those skilled in the art can choose according to a particular situation, which is not particularly limited herein. It should be noted that a case that the critical dimension of the first trench 51 may remain unchanged from a top position of the first trench 51 toward a direction close to the second trench 52 exists. In practical application, when the first trench 51 is formed, a case that the critical dimension of the top of the first trench 51 is slightly smaller than that of the bottom due to the etching process is ignored. This case belongs to the foregoing case described in the embodiment of the present disclosure.

Further etching downward can be stopped when it is performed on the etching stop layer 3, to form the first trench 51, and provide conditions for the subsequent self-alignment implantation.

Step S1200: Perform a self-alignment implantation inclined on a part of the first interlayer dielectric layer 2 corresponding to a bottom of the first trench 51, and form a self-alignment implantation region S.

As shown in FIG. 8, an inclined self-alignment implantation is performed on the bottom of the first trench 51 at an angle α of 70° to 90° such as 75°, 80°, or 86°, which is not particularly limited herein. The self-alignment implantation angle α is an included angle (the direction of the double-headed arrow shown in FIG. 8) between a direction of the self-alignment implantation and a first direction F1.

Through the inclined self-alignment implantation, the self-alignment implantation region S of which a cross section is an inverted trapezoid can be formed in the first interlayer dielectric layer 2 between the first trench 51 and the top electrode 14. In other words, the dimension of the cross section of the self-alignment implantation region S gradually decreases from the bottom of the first trench 51 to the direction close to the insulating layer 15, and the minimum dimension of the cross section of the self-alignment implantation region S is smaller than that of the cross section of the top electrode 14, or the inverted trapezoid is an isosceles trapezoid of which an upper side is longer than the lower side. In this way, when the through via 5 is subsequently formed through etching, the etching range does not extend beyond both sides of the top electrode 14 along the first direction F1, preventing the damage on the MTJ 13 because the over-etching leads to the communication of the MTJ 13.

The etch selectivity ratio is proportional to the ion implantation concentration, and therefore in an embodiment, during the self-alignment implantation, a concentration (the amount) of the implanted element of the self-alignment implantation region S gradually decreases from the top of the first interlayer dielectric layer 2 toward the direction close to the top electrode 14, such that the etch selectivity ratio of a part, of the first interlayer dielectric layer 2, into which the ions are implanted gradually decreases from top to bottom, which is beneficial to the fast etching on the upper part. In addition, in this embodiment, the ion implantation concentration of the self-alignment implantation region gradually decreases from a perpendicular bisector L of the cross section of the self-alignment implantation region along the first direction toward two sides away from the perpendicular bisector L. Therefore, in the first direction, a part closer to the perpendicular bisector L has a bigger etch selectivity ratio, and a faster etching speed compared to the two sides, and the self-alignment implantation region S in the shape of the inverted trapezoid is likely to be formed.

In another embodiment, the ion implantation concentration of the self-alignment implantation region may be set to gradually decrease from the perpendicular bisector L of the cross section of the self-alignment implantation region along the first direction toward two sides away from the perpendicular bisector L, which, in this way, is also beneficial to forming the self-alignment implantation region S in the shape of the inverted trapezoid.

Figure 9:
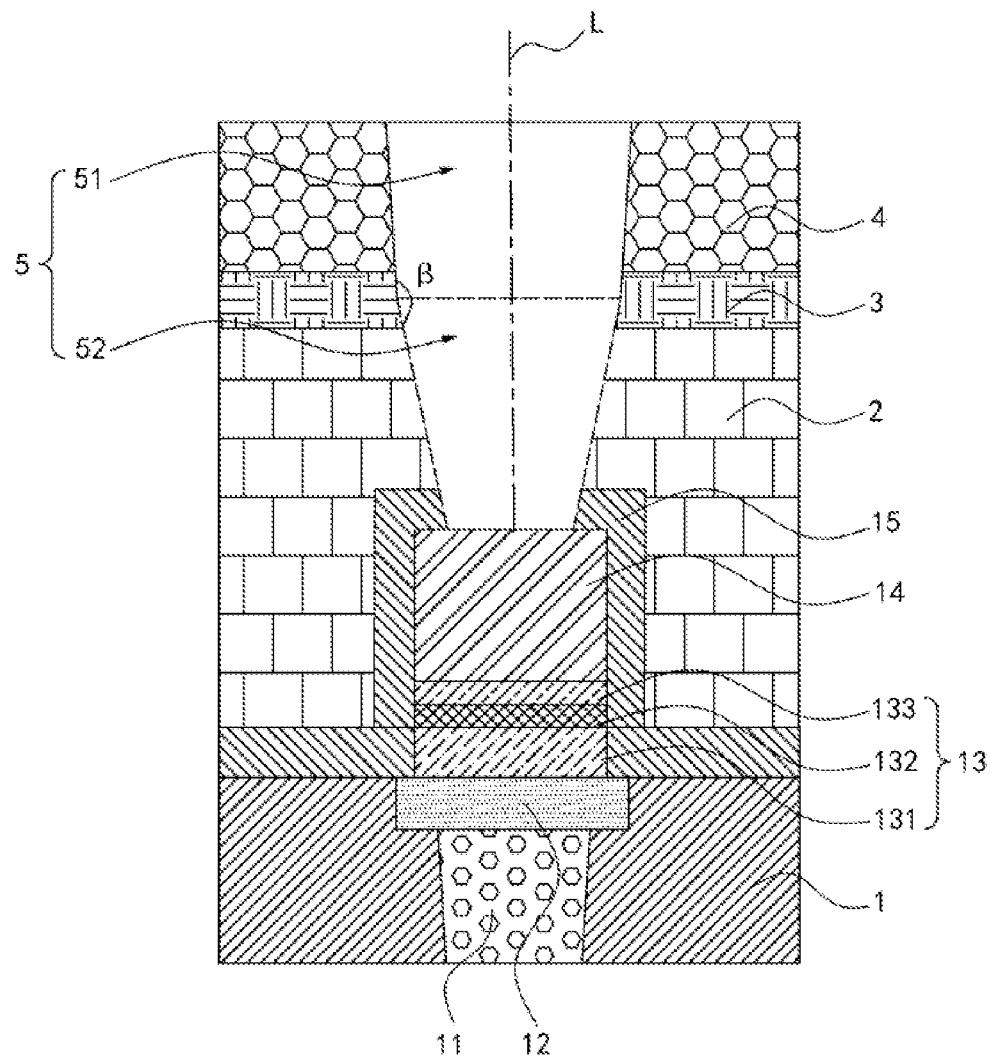
FIG. 9 is a schematic diagram of forming a through via according to an exemplary implementation of the present disclosure.

It should be noted that as shown in FIG. 9, the perpendicular bisector L is perpendicular to the first direction, and crosses through the middle part of the bottom of the cross section of the self-alignment implantation region S. Certainly, the self-alignment implantation region S may further include the etching stop layer 3 located at the bottom of the first trench 51. That is, when the bottom of the first trench 51 is the etching stop layer 3, after the self-alignment implantation, the ions are also implanted into the etching stop layer 3. In this way, the etch selectivity ratio of the etching stop layer 3 can be improved, such that the etching stop layer 3 and the self-alignment implantation region S in the first interlayer dielectric layer 2 are etched through a same process, thereby reducing the process steps.

In some embodiments, the implanted element of the self-alignment implantation is at least one of C, N, O, F, Ar, Ne, B, or Cl. The specific implantation process is as follows: an amount of energy is supplied to a gas containing the implanted element, the gas is dissociated into an ion current, and then the ion current is implanted into the self-alignment implantation region S. The initial value range of the implanted energy may be 2 keV to 25 keV such as 5 keV, 10 keV, 15 keV or 20 keV. KeV is an energy unit, and 1 keV=$1.6*10-16$ joules.

In the practical operation, a part (the unetched part) of the second interlayer dielectric layer 4 outside the first trench 51 may be used as a mask for the self-alignment implantation process, such that a large quantity of ions are merely implanted into the self-alignment implantation region S of the first interlayer dielectric layer. To enhance the mask effect, the second interlayer dielectric layer 4 may also be of a composite structure. For example, a thin layer with a better blocking effect on implanted ions is composited on its upper surface. Although a small quantity of ions are also implanted into the second interlayer dielectric layer 4, the ions are only implanted into a thin layer on the second interlayer dielectric layer 4 or only into a thin layer of the composite structure, without affecting the subsequent process. The layer can be removed through the consumption during the subsequent etching or polishing to form the second trench.

In addition, because the sidewall of the first trench 51 has a blocking effect, that is, the sidewall shadow effect, the ions can be further controlled to be implanted into the bottom of the first trench 51. Because the implantation angle α is 70° to 90°, the inclination angle is small, and few ions of the ion beam are implanted into the sidewall surface. The ions may be ignored and do not affect the subsequent process. Therefore, during the inclined self-alignment implantation performed at the implantation angle α, ion beams can be implanted intensively into the self-alignment implantation region S with a dimension gradually decreased, and the ions can be prevented from being implanted into the second interlayer dielectric layer 4, to generate an adverse effect.

Through the self-alignment implantation process, the ions implanted into the self-alignment implantation region S in the first interlayer dielectric layer 2 can change the physical or chemical property of the self-alignment implantation region S or can damage the structure, increasing the etch selectivity ratio of this part. For example, in some embodiments, an etch selectivity ratio of the self-alignment implantation region S in the first interlayer dielectric layer 2 to a part of the first interlayer dielectric layer 2 without the self-alignment implantation is greater than 1. For example, the etch selectivity ratio is 2, 5, 10, 20, 30, 50, 60, 70, 80 or bigger, which is not particularly limited herein. Therefore, when the first interlayer dielectric layer 2 is etched, the self-alignment implantation region S can be preferentially etched by adjusting the etching process or parameters. Therefore, the etching range is limited to the self-alignment implantation region S, which avoids the over-etching. For example, it is avoided that in the first direction F1, the dimension of the through via 5 formed finally is greater than that of the top electrode 14. Moreover, in a direction perpendicular to the direction F1, the selective etching can be stopped in time when it is performed on the bottom of the self-alignment implantation region S, without etching the insulating layer 15, thereby avoiding that the performance of the MTJ 13 deteriorates because the over-etching in the direction causes the through via 5 to recess into the insulating layer 15 of the MTJ 13, and that the MTJ 13 is contaminated by metal.

Step S1400: Continuously etch through the first trench 51 to a top end surface of the top electrode 14, and form a second trench 52, wherein the first trench 51 and the second trench 52 connect to each other to form a through via 5, and a critical dimension of the second trench 52 gradually decreases from a bottom position of the first trench 51 toward a direction close to the top electrode 14.

As shown in FIG. 9, after the self-alignment implantation, a part of the etching stop layer 3 at the bottom of the first trench 51 is etched first, and then the self-alignment implantation region S is selectively etched through a proper etching process. The proper etching process may be selected according to the type of the implanted element. The etching is performed by using at least one gas of $CF_4$, $CH_3OH$, or $CH_4/Ar$. For example, when the implanted element is boron (B), the B element damages the structure of a part of the first interlayer dielectric layer 2. The selective etching may be performed through a physical bombardment. In addition, by adjusting the atomic ratios of C, O, and F in the etching gas, the dimension of the cross section of the second trench 52 gradually decreases from top to bottom. When the implanted element is N, a gas with a greater etching rate for $SiN_x$ may be selected or adjusted. Those skilled in the art can select or adjust the etching gas according to a specific implanted element, which is not described again in detail herein.

With reference to FIG. 9, the maximum critical dimension of the second trench 52 is smaller than or equal to the minimum critical dimension of the first trench 51. In addition, there is an included angle between the sidewall of the first trench 51 and the sidewall of the second trench 52, and the included angle is an obtuse angle β, which may be 150°, 160°, 170° or 180°, which is not particularly limited, thereby further ensuing that the dimension of the second trench 52 gradually decreases from top to bottom.

In the practical operation, the self-alignment implantation region S and the insulating layer 15 are etched sequentially from the bottom of the first trench 51. That is, the foregoing selective etching is performed first to form the second trench 52. The bottom of the second trench 52 is the bottom of the self-alignment implantation region S. The lower part of the second trench 52 is the insulating layer 15, which therefore avoids that the second trench 52 runs through the insulating layer 15 directly to enter the top electrode 14, thus causing a damage on the top electrode 14. After the selective etching, the insulating layer 15 is etched through another etching process, such that the bottom of the second trench 52 continuously extends downward to the surface of the top electrode 14, that is, to form the final through via 5. Because the insulating layer 15 is quite thin, the required etching amount is also quite small, and it is easy to control the etching amount and dimension, such that the through via 5 can be connected to the top electrode 14 and does not damage the top electrode 14.

Step S1600: Fill the through via 5 with a TEC 6.

Figure 10:
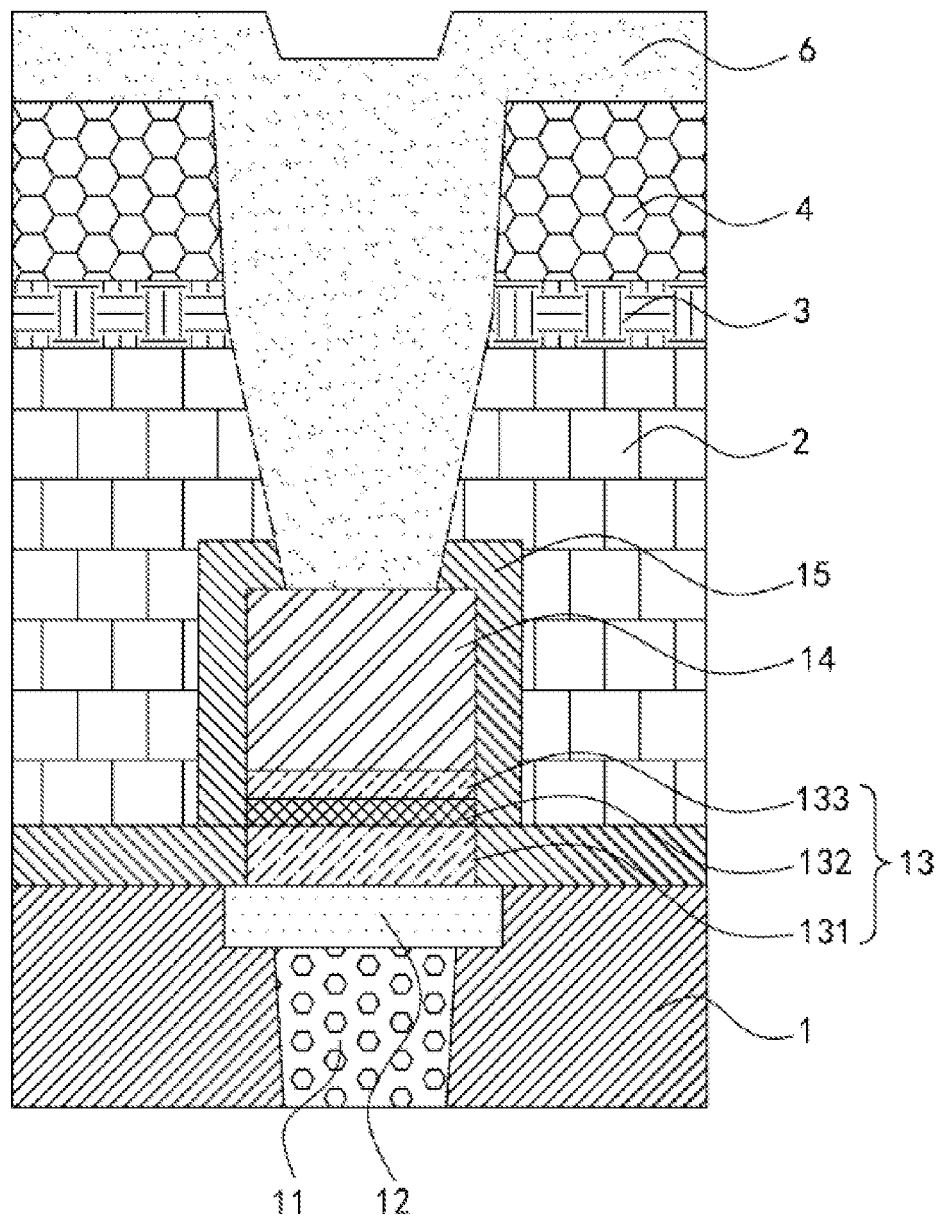
FIG. 10 is a schematic diagram of filling the through via with a TEC according to an exemplary implementation of the present disclosure.
Figure 11:
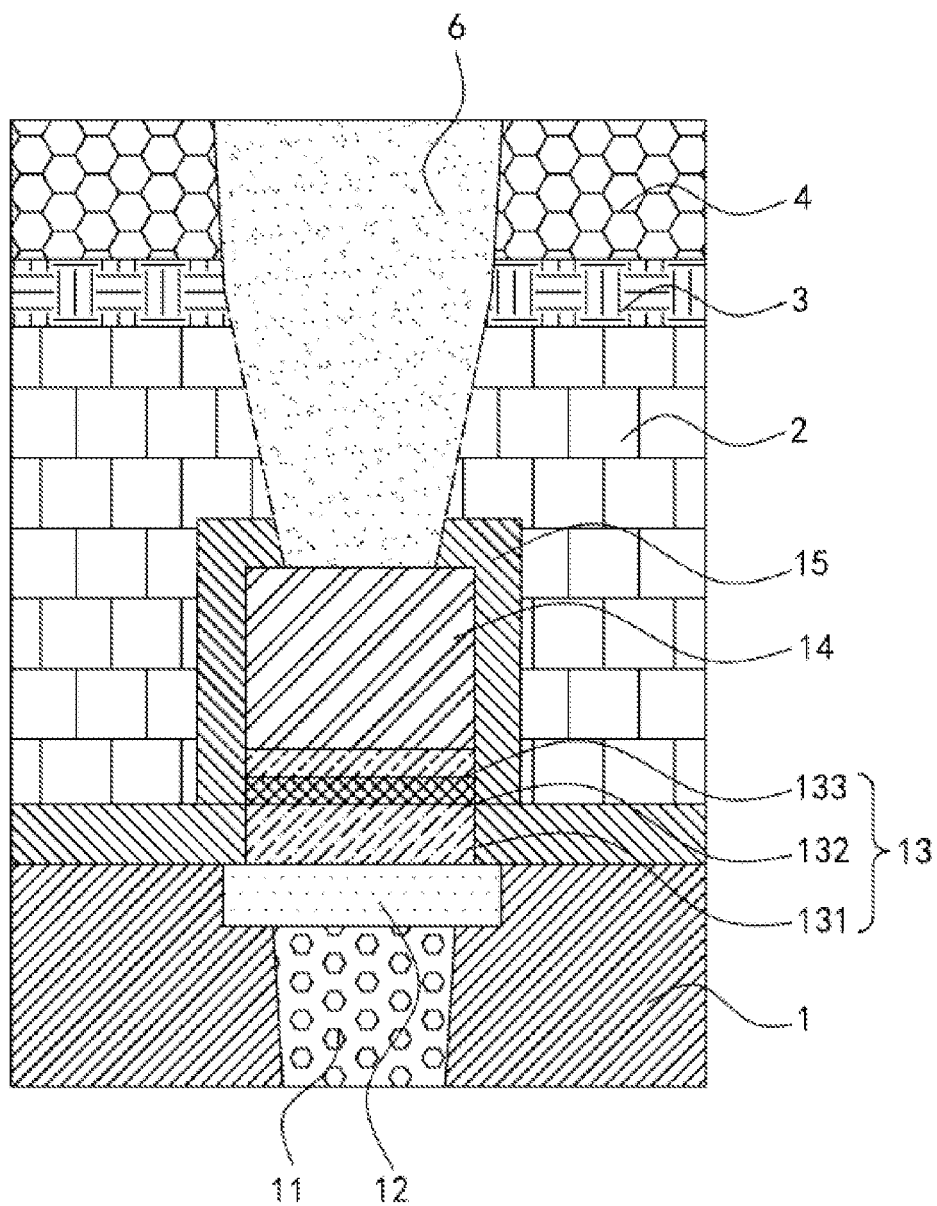
FIG. 11 is a schematic diagram of the TEC after polishing according to an exemplary implementation of the present disclosure.

As shown in FIG. 10, step S1600 may specifically include: depositing the TEC 6 in the through via 5 and on an upper surface of the second interlayer dielectric layer 4. Then, a part of the TEC 6 on the upper surface of the second interlayer dielectric layer 4 and a part of the TEC 6 located at a top of the through via 5 and protrudes from the upper surface of the second interlayer dielectric layer 4 are removed through a CMP process such that a remaining part of the TEC 6 is flush with the second interlayer dielectric layer 4, and form the structure shown in FIG. 11.

In some embodiments, the TEC 6 may be made of tungsten or copper.

In summary, in the method of manufacturing a MRAM in the embodiments of present disclosure, the etching stop layer 3 is disposed on the first interlayer dielectric layer 2, such that the etching is performed until the etching stop layer 3 is reached to form a first trench 51. Moreover, through a self-alignment implantation, a self-alignment implantation region S is formed in the first interlayer dielectric layer 2, to improve the etch selectivity ratio of the self-alignment implantation region S, such that during the following etching, the dimension of the through via 5 can be controlled accurately, the controllability for forming the through via 5 and the dimension uniformity are improved, and it is avoided that a critical dimension of the through via or trench is greater than those of the top electrode 14 and MTJ due to the over-etching, thereby avoiding the performance deterioration of the MTJ and metal contamination to the MTJ in the subsequent process, and improving the yield of the MRAM.

According to another aspect of the present disclosure, a MRAM is provided and manufactured by using the method according to any one of the foregoing embodiments.

In the MRAM in the embodiments of the present disclosure, the TEC 6 and the MTJ 13 of the MRAM match in size, and the MTJ 13 cannot be contaminated by the metal element of the TEC 6, to ensure the performance and higher yield of the MRAM.

It should be understood that the present disclosure does not limit its application to the detailed structure and arrangement of components set forth in this specification. The present disclosure can have other implementations and can be implemented and executed in various ways. Variations and modifications of the foregoing implementations fall within the scope of the present disclosure. It will be understood that the disclosure disclosed and defined in this specification extends to all alternative combinations of two or more individual features mentioned or apparent in the text and/or drawings. All of these different combinations constitute various alternative aspects of the present disclosure. The implementations described in this specification illustrate the known optimal manner for implementing the present disclosure, and enables those skilled in the art to use the present disclosure.

The invention claimed is:

1. A method of manufacturing a magnetic random access memory, comprising:
   preparing a bottom electrode through hole, a bottom electrode, a magnetic tunnel junction, a top electrode, and an insulating layer sequentially on a semiconductor substrate;
   forming a first interlayer dielectric layer on the insulating layer;
   forming an etching stop layer on the first interlayer dielectric layer;
   forming a second interlayer dielectric layer on the etching stop layer;
   etching a part of the second interlayer dielectric layer above the top electrode to the etching stop layer, and forming a first trench;
   performing a self-alignment implantation inclined on a part of the first interlayer dielectric layer corresponding to a bottom of the first trench, and forming a self-alignment implantation region;
   continuously etching through the first trench to a top end surface of the top electrode, and forming a second trench, wherein the first trench and the second trench connect to each other to form a through via, and a critical dimension of the second trench gradually decreases from a bottom position of the first trench toward a direction close to the top electrode; and
   filling the through via with a top electrode contact; and,
   wherein a cross section of the self-alignment implantation region is an inverted trapezoid, an ion implantation concentration of the self-alignment implantation region gradually decreases from a top of the first interlayer dielectric layer toward a direction close to the top electrode, and/or the ion implantation concentration of the self-alignment implantation region gradually decreases from a perpendicular bisector of the cross section of the self-alignment implantation region along the first direction toward two sides away from the perpendicular bisector.

2. The method according to claim 1, wherein an implantation angle of the self-alignment implantation is an included angle between a direction of the self-alignment implantation and a first direction.

3. The method according to claim 2, wherein the implantation angle is 70° to 90°.

4. The method according to claim 1, wherein the inverted trapezoid is an isosceles trapezoid.

5. The method according to claim 1, wherein an implanted element of the self-alignment implantation is at least one of C, N, O, F, Ar, Ne, B, or Cl.

6. The method according to claim 5, wherein a maximum critical dimension of the second trench is smaller than or equal to a minimum critical dimension of the first trench.

7. The method according to claim 6, wherein there is an included angle between a sidewall of the first trench and a sidewall of the second trench, and the included angle is an obtuse angle.

8. The method according to claim 1, wherein the continuously etching through the first trench to a top end surface of the top electrode, and forming a second trench comprises:
   etching the self-alignment implantation region and the insulating layer sequentially from the bottom of the first trench, wherein an etch selectivity ratio of the self-alignment implantation region in the first interlayer dielectric layer to a part of the first interlayer dielectric layer without the self-alignment implantation is greater than 1.

9. The method according to claim 8, wherein the first interlayer dielectric layer, the etching stop layer, and the second interlayer dielectric layer are all formed through a deposition process, and the deposition process comprises an atomic layer deposition process, a chemical vapor deposition process, a physical vapor deposition process, or a spin coating process.

10. The method according to claim 1, wherein the filling the through via with a top electrode contact comprises:
    depositing the top electrode contact in the through via and on an upper surface of the second interlayer dielectric layer; and
    removing a part of the top electrode contact on the upper surface of the second interlayer dielectric layer and a part of the top electrode contact located at a top of the through via and protrudes from the upper surface of the second interlayer dielectric layer, such that a remaining part of the top electrode contact is flush with the second interlayer dielectric layer.

11. The method according to claim 1, wherein the top electrode contact is metal tungsten or copper.

12. The method according to claim 1, wherein the magnetic tunnel junction comprises: a reference layer, a barrier layer, and a memory layer stacked sequentially.

13. The method according to claim 1, wherein the first interlayer dielectric layer and the second interlayer dielectric layer each comprise at least one of silicon dioxide, silicon oxynitride, silicon nitride, or a low-k dielectric.

14. The method according to claim 1, wherein the etching stop layer comprises at least one of silicon carbide, silicon nitride, silicon oxide, or silicon oxynitride.

15. The method according to claim 1, wherein the etching stop layer comprises a plurality of layers, and a material of each of the layers is the same.

16. A magnetic random access memory, manufactured by using the method according to claim 1.

* * * * *